United States Patent
Kluska et al.

(10) Patent No.: US 9,435,527 B1
(45) Date of Patent: Sep. 6, 2016

(54) THERMAL VENTING APPARATUS AND METHOD FOR LED MODULES

(71) Applicant: UNIVERSAL LIGHTING TECHNOLOGIES, INC., Madison, AL (US)

(72) Inventors: Theodore E. Kluska, Madison, AL (US); Travis L. Berry, Madison, AL (US)

(73) Assignee: Universal Lighting Technologies, Inc., Madison, AL (US)

( * ) Notice: Subject to any disclaimer, the term of this patent is extended or adjusted under 35 U.S.C. 154(b) by 156 days.

(21) Appl. No.: 14/504,705

(22) Filed: Oct. 2, 2014

Related U.S. Application Data

(60) Provisional application No. 61/886,862, filed on Oct. 4, 2013.

(51) Int. Cl.
| | |
|---|---|
| *F21V 29/00* | (2015.01) |
| *F21V 5/04* | (2006.01) |
| *F21V 19/00* | (2006.01) |
| *F21Y 101/02* | (2006.01) |

(52) U.S. Cl.
CPC .................. *F21V 29/22* (2013.01); *F21V 5/04* (2013.01); *F21V 19/001* (2013.01); *F21V 29/004* (2013.01); *F21Y 2101/02* (2013.01)

(58) Field of Classification Search
CPC ........ F21V 29/22; F21V 29/004; F21V 5/04; F21V 19/001
See application file for complete search history.

(56) References Cited

U.S. PATENT DOCUMENTS

| | | | |
|---|---|---|---|
| 5,612,576 A * | 3/1997 | Wilson | H01L 23/3128 257/787 |
| 5,904,414 A | 5/1999 | Monteone et al. | |
| 7,883,244 B2 | 2/2011 | Hsu et al. | |
| 8,157,419 B2 * | 4/2012 | Hand | F21K 9/00 362/249.02 |
| 2002/0139990 A1 * | 10/2002 | Suehiro | F21V 29/74 257/99 |
| 2008/0158887 A1 * | 7/2008 | Zhu | F21V 29/004 362/294 |
| 2010/0314655 A1 * | 12/2010 | Thompson | F21K 9/00 257/99 |
| 2011/0031864 A1 * | 2/2011 | Rebergen | F21K 9/00 313/11 |

* cited by examiner

*Primary Examiner* — Mary Ellen Bowman
(74) *Attorney, Agent, or Firm* — Patterson Intellectual Property Law, P.C.; Mark J. Patterson

(57) ABSTRACT

A light emitting apparatus includes a substrate, a light emitter mounted on the substrate, and a lens at least partially covering the light emitter, the lens defining a space about the light emitter. A heat sink is attached to the substrate. The heat sink is configured to dissipate heat from the light emitter via the substrate. The substrate includes an opening communicated with the space. A vent passage is at least partially defined between the heat sink and the substrate, the vent passage communicating the opening in the substrate with an exterior of the heat sink.

20 Claims, 10 Drawing Sheets

THERMAL VENTING APPARATUS AND METHOD FOR LED MODULES A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

This application claims benefit of the following patent application which is hereby incorporated by reference: U.S. Patent Application No. 61/886,862, filed Oct. 4, 2013, entitled Thermal Venting Apparatus and Method for LED Modules.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

The present invention relates generally to lighting systems used for illumination of a specified area. More particularly, this invention pertains to a lighting system having an improved ventilation system.

Conventional lighting systems include a light emitter mounted on a substrate that is enclosed by a lens, the lens forming a cavity around the light emitter. When the lighting system is in use, the light emitter can produce a substantial amount of heat, which can raise the temperature inside the lens cavity. The increase in temperature can cause chemicals present in certain components of the lighting system such as adhesives, flux residues, or resins to produce certain harmful gases. The gases produced can cause the lens of the lighting system to fog or discolor. The fogging or discoloration of the lens can attenuate the light passing through the lens, which can undesirably affect the illuminated appearance or overall light output of the lighting system. This problem is particularly prevalent in LED lighting systems, as LEDs conventionally produce a large amount of heat during operation.

In an attempt to combat this light attenuation, conventional lighting systems may include a vent through the optical lens itself. Additionally, the vent includes a permeable material that allows the gases created during operation of the lighting system to escape. However, the cost of the permeable material as well as the difficulty in correctly placing and verifying proper placement of the vent directly in the lens is very high. Another disadvantage of these solutions is the potential distortion or lack of uniformity of the optical pattern by placing a vent directly in the lens.

What is needed, then, are improvements to the ventilation in LED lighting systems, particularly LED lighting systems.

BRIEF SUMMARY OF THE INVENTION

The present invention is generally related to a lighting system with improved ventilation.

One aspect of the present invention is a light emitting apparatus including a substrate and a light emitter mounted on the substrate. A lens can at least partially cover the light emitter, the lens defining a space about the light emitter. A heat sink is attached to the substrate. The heat sink is configured to dissipate heat away from the light emitter via the substrate. The substrate includes an opening which is in fluid communication with the space about the light emitter. A vent passage is least partially defined between the heat sink and the substrate. The vent passage provides fluid communication from the opening in the substrate with an exterior of the heat sink. As such, gases which are produced due to an increased temperature of the lighting apparatus during operation and which are contained in the space about the light emitter can be ventilated through the vent passage. The ventilation can help prevent discoloration or fogging of the lens.

Another aspect of the present invention is a light emitting apparatus including a substrate and an LED mounted on the substrate. A lens is attached to the substrate, the lens defining a space about the LED between the lens and the substrate. A heat sink is attached to the substrate. The heat sink is configured to dissipate heat away from the LED via the substrate. The substrate includes an opening in fluid communication with the space about the LED. The apparatus includes a vent passage at least partially defined between the substrate and the heat sink. The vent passage provides fluid communication from the opening in the substrate with an exterior of the apparatus.

Another aspect of the present invention is a method of venting an LED including the steps of mounting an LED on a substrate, covering the LED with a lens to form an LED cavity about the LED, the LED cavity formed between the substrate and the lens, attaching a heat sink to the substrate on a side of the substrate opposite the LED, providing an opening in the substrate in communication with the LED cavity, and providing a vent passage at least partially defined between the substrate and the heat sink, the vent passage communicating the opening in the substrate and the LED cavity with an exterior of the heat sink.

One object of the present invention is to provide ventilation for unwanted gases produced during the operation of lighting systems.

Another object of the present invention is to provide thermal dissipation of heat produced during the operation of lighting systems.

A further object of the present invention is to provide a light emitting apparatus with uniform light emission.

Yet another object of the present invention is to reduce discoloration and fogging of a lens in a lighting apparatus.

DETAILED DESCRIPTION OF THE INVENTION

Figure 1:
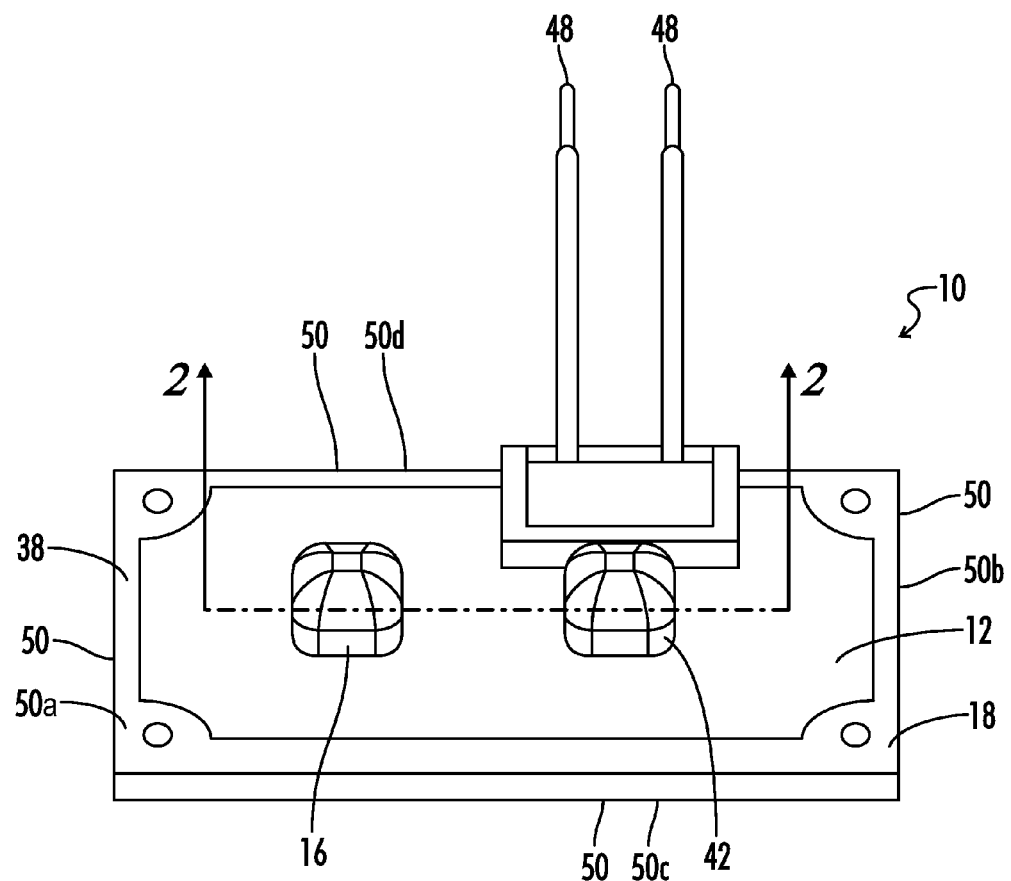
FIG. 1 is a perspective view of an embodiment of a light emitting apparatus according to the present invention.

While the making and using of various embodiments of the present invention are discussed in detail below, it should be appreciated that the present invention provides many applicable inventive concepts that is embodied in a wide variety of specific contexts. The specific embodiments discussed herein are merely illustrative of specific ways to make and use the invention and do not delimit the scope of the invention.

To facilitate the understanding of the embodiments described herein, a number of terms are defined below. The terms defined herein have meanings as commonly understood by a person of ordinary skill in the areas relevant to the present invention. Terms such as "a," "an," and "the" are not intended to refer to only a singular entity, but rather include the general class of which a specific example may be used for illustration. The terminology herein is used to describe specific embodiments of the invention, but their usage does not delimit the invention, except as set forth in the claims.

As described herein, an upright position is considered to be the position of apparatus components while in proper operation or in a natural resting position as described herein. Vertical, horizontal, above, below, side, top, bottom and other orientation terms are described with respect to this upright position during operation unless otherwise specified. The term "when" is used to specify orientation for relative positions of components, not as a temporal limitation of the claims or apparatus described and claimed herein unless otherwise specified. The term "lateral" denotes a side to side direction when facing the "front" of an object.

The phrase "in one embodiment," as used herein does not necessarily refer to the same embodiment, although it may. Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

This written description uses examples to disclose the invention and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

It will be understood that the particular embodiments described herein are shown by way of illustration and not as limitations of the invention. The principal features of this invention may be employed in various embodiments without departing from the scope of the invention. Those of ordinary skill in the art will recognize numerous equivalents to the specific procedures described herein. Such equivalents are considered to be within the scope of this invention and are lensed by the claims.

All of the compositions and/or methods disclosed and claimed herein may be made and/or executed without undue experimentation in light of the present disclosure. While the compositions and methods of this invention have been described in terms of the embodiments included herein, it will be apparent to those of ordinary skill in the art that variations may be applied to the compositions and/or methods and in the steps or in the sequence of steps of the method described herein without departing from the concept, spirit, and scope of the invention. All such similar substitutes and modifications apparent to those skilled in the art are deemed to be within the spirit, scope, and concept of the invention as defined by the appended claims.

A perspective view of a first embodiment of a light emitting apparatus 10 according to the present invention is shown in FIG. 1. The apparatus 10 can include a substrate 12. A light emitter 14 (FIG. 2) can be mounted on the substrate 12. A lens 16 can at least partially cover the light emitter 14. In FIG. 1, the light emitter 14 is located under the lens 16. A heat sink 18 can be attached to the substrate 12. In some embodiments, the heat sink 18 can be attached to the substrate 12 on a side of the substrate 12 opposite the light emitter 14. The heat sink 18 can be configured to dissipate heat away from the light emitter 14 via the substrate 12.

Figure 2:
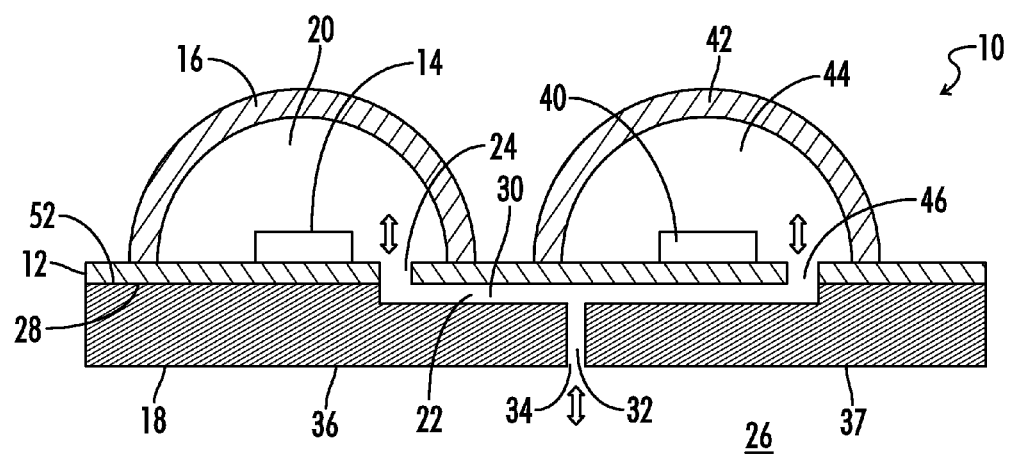
FIG. 2 is a partial cross-sectional view of the light emitting apparatus of FIG. 1.

A partial cross-section view of the lighting apparatus 10 of FIG. 1 is shown in FIG. 2. The lens 16 can define a space 20 about the light emitter 14. The space 20 can be defined between the lens 16 and the substrate 12 in some embodiments. The substrate 12 can include an opening 24 which is in fluid communication with the space 20 about the light emitter 14. The apparatus 10 can also include a vent passage 22. The vent passage 22 can be at least partially defined between the heat sink 18 and the substrate 12. The vent passage 22 can communicate the opening 24 in the substrate 12, and therefore the space 20 about the light emitter 14, with an exterior 26 of the heat sink 18, or an exterior 26 of the apparatus 10.

The substrate 12 can be formed of any material that is suitable to serve as a foundation upon which an electronic device can be mounted. Such materials can include, but are not limited to, a printed circuit board, metal clad circuit board, silicon, silicon dioxide, aluminum dioxide, sapphire, germanium, gallium arsenide, an alloy of silicon and germanium, indium phosphide or any other material known in the art. The substrate 12 can also include lead wires 48 which can be used to connect the substrate 12 and the light emitter 14 to a power source, as shown in FIG. 1.

In some embodiments, the light emitter 14 can be a light emitting device including, but not limited to, LEDs, incandescent bulbs, lamps or light globes, fluorescent lamps or tubes, arc lamp, sulfur lamp or any other suitable light emitting device known in the art.

The heat sink 18 can be formed of any suitable material that can be configured to act as a passive heat exchanger. These materials can include, but are not limited to, aluminum alloys such as 1050A, 6061, or 6063, copper, diamond, or composite materials such as copper tungsten pseudoalloy, graphite, silicon carbide in aluminum matrix (AlSiC), diamond in copper-silver alloy matrix (Dymalloy), beryllium oxide in beryllium matrix, or any other suitable materials known in the art.

As the apparatus 10 is being used, the light emitter 14 can produce a substantial amount of heat. Because the light emitter 14 is mounted to the substrate 12, heat from the light emitter 14 can be dissipated to the substrate 12. The heat sink 18 can then be attached to the substrate 12 to dissipate heat away from the light emitter 14 via the substrate 12.

In some embodiments as shown in FIG. 1, the heat sink 18 can act as a housing for the other components of the apparatus 10. The heat sink 18 can have a raised peripheral rim 38 around the upper perimeter of the heat sink 18. The raised peripheral rim 38 can form a cavity. The substrate 12 having the lens 16 and light emitter 14 attached thereto can then be inserted into the cavity such that the heat sink 18 can function as a housing for the apparatus 10.

Referring again to FIG. 2, the lens 16 defines the space 20 about the light emitter 14. In some embodiments, the lens 16 can be attached to the substrate 12 to define the space 20 about the light emitter 14. As such, the space 20 can be defined between the lens 16 and the substrate 12. In some embodiments, the lens 16 can be a dome-like shape. The shape of the lens 16 can be configured to produce different lit appearances for different applications. For instance, in some embodiments, the lens 16 can be an asymmetrical lens for use in a directional lighting system. In other embodiments the lens 16 can include diffusers, micro lenses, micro prisms, Fresnel Patterns, or kinoforms to produce different lighting profiles. In some embodiments, the lens 16 can be formed of a heat-resistant plastic material such as a polycarbonate, a glass material, or any other suitable material known in the art.

The vent passage 22 can be configured to vent the space 20 about the light emitter 14. During operation of the light emitting apparatus 10, light emitters 14 can produce a considerable amount of heat which in turn can heat the area around the light emitter 14 and the substrate 12. The area around the light emitter 14 and the substrate 12 can include a number of chemicals which are components of adhesives, sealants, or other resins present on the apparatus 10. As these chemicals are heated during operation, the chemicals can produce gases which can be retained in the space 20 about the light emitter 14. These gases can be harmful to the integrity of the lens 16 and can cause the lens 16 to fog or discolor. Discoloration or fogging of the lens 16 can result in attenuation of the light being emitted by the light emitter 14 as the light passes through the lens 16 which can reduce the amount of light that ultimately reaches the target area. Thus, the output of the apparatus 10, as well as the lit appearance, can be affected by the accumulation of gases within the space 20. This problem is particular prevalent in LED lighting systems, as LEDs typically produce a substantial amount of heat while in use.

As the temperatures of the light emitting apparatus 10 and the space 20 about the light emitter 14 increase, the pressure inside the space 20 can also increase. Additionally, gases produced by chemicals on the light emitting apparatus 10 can be retained in the space 20, which can further increase the pressure within the space 20. This increase in pressure can place significant stress on the components of the light emitting apparatus 10, and can result in a reduction in productivity, efficiency, and longevity.

Gases can be vented from the space 20 through the opening 24 in the substrate 12 and the vent passage 22 and be expelled to an exterior 26 of the heat sink 18. Venting of the gases contained within the space 20 about the light emitter 14 can help reduce discoloration or fogging of the lens 16 caused by the harmful gases. Additionally, ventilation of the space 20 can help reduce the pressure within the space 20.

In some embodiments, as seen in FIG. 2, the heat sink 18 can include a substrate mating surface 28. The substrate mating surface 28 can be attached to the substrate 12. A channel 30 can be defined in the substrate mating surface 28 of the heat sink 18. The channel 30 can be communicated with the opening 24 in the substrate 12. The channel 30 can form at least a portion of the vent passage 22 between the heat sink 18 and the substrate 12. In some embodiments, the vent passage 22 can further include a vent hole 32 through the heat sink 18. The vent hole 32 can communicate the channel 30 in the heat sink 18 with an exterior 26 of the heat sink 18. As such, the vent hole 32 can communicate the opening 24 in the substrate 12 and the space 20 about the light emitter 24 via the channel 30 with the exterior 26 of the heat sink 18. In some embodiments, as shown in FIG. 2, the vent hole 32 and the vent passage 22 can have an exit opening 34 in an exterior surface 36 of the heat sink 18 opposite the substrate mating surface 28 on the heat sink 28. Thus, gases are vented through the bottom 37 of the heat sink 18.

Having the vent passage 22 pass through different areas of the heat sink 18 can help increase the thermal performance of the light emitting apparatus 10. Heat sinks are typically attached to lighting devices to provide thermal dissipation of heat mainly through radiation to an exterior of the apparatus 10. Having the vent passage 22 defined across or through the heat sink 18 can allow a flow of gas or air over the heat sink 18, which can increase the thermal dissipation of heat from the light emitter 14 through convection as well as radiation.

An increase in thermal dissipation from the light emitter 14 can help regulate the temperature in the light emitting apparatus 10 and the space 20 about the light emitter 14, which can therefore help reduce the amount of harmful gases being produced by chemicals on the apparatus 10. A reduction in heat can also help reduce the pressure within the space 20 about the light emitter 14. Thus, the vent passage 22 can offer the benefit of ventilation of harmful gases within the space 20, as well as provide a convection path over the heat sink 18 to help reduce the temperature of the apparatus 10 and the amount of gases being produced.

In other embodiments, the substrate 12 can have a heat sink 18 mating surface 52 which can be attached to the heat sink 18. The channel 30 in some embodiments can be defined in the heat sink mating surface 52 of the substrate 12 such that the vent passage 22 is at least partially defined by the channel 30 defined in the substrate 12. Again, gases venting through the vent passage 22 can be allowed to flow through the channel 30 across the heat sink 18, which can help increase convection and thermal dissipation of heat from the light emitter 14. As such, the channel 30 can be defined in either the heat sink 18 or the substrate 12, which can provide flexibility in manufacturing the vent passage 22 while still achieving the same benefits. The channel 30 can be cut, milled, injection molded, forged, etc. into either the substrate 12 or the heat sink 18 to form at least a portion of the vent passage 22.

In some embodiments, the apparatus 10 can include a second light emitter 40 mounted on the substrate 12. A second lens 42 can at least partially cover the second light emitter 40. The second lens 42 can define a second space 44 around the second light emitter 40. The substrate 12 can include a second opening 46, the second opening 46 communicated with the second space 44. The vent passage 22 can then be communicated with the second opening 46 as well as the opening 24 in the substrate 12. The vent passage 22 can therefore additionally communicate the second opening 46 and the second space 44 with an exterior 26 of the heat sink 18. As such, the same vent passage 22 can be used to ventilate multiple spaces 20 and 44 around multiple light emitters 14 and 40.

Figure 3:
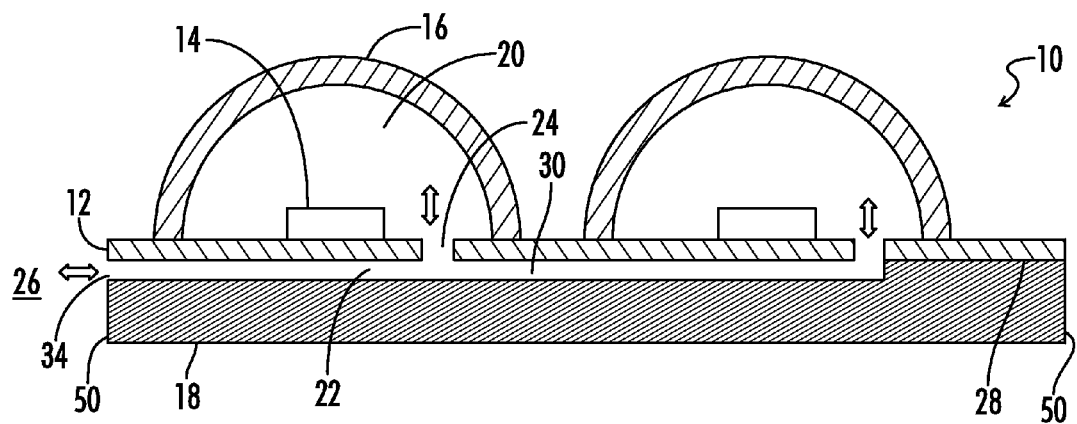
FIG. 3 is a partial cross-sectional view of a second embodiment of a light emitting apparatus according to the present invention.

Referring again to FIG. 1, the heat sink 18 can include a lateral perimeter surface 50. The lateral perimeter surface 50 can be defined by a first lateral surface 50a, a second lateral surface 50b, a front surface 50c, and a back surface 50d. FIG. 3 shows a partial cross-section view of a second embodiment of a light emitting apparatus 10 of the present invention. The vent passage 22 in FIG. 3 can include a channel 30 defined in the substrate mating surface 28. The channel 30 can be communicated with the opening 24 in the substrate 12. The channel 30 can extend through the lateral perimeter surface 50 of the heat sink 18 to communicate the opening 24 in the substrate 12 with an exterior 26 of the heat sink 18. The exit opening 34 for the vent passage 22 can then be located in the lateral perimeter surface 50 of the heat sink 18. Thus, the channel 30 can constitute the entire vent passage 22. The channel 30 in FIG. 3 extends through a first lateral surface 50a of the heat sink 18. However, the channel 30 in other embodiments can extend through any of the surfaces of the lateral perimeter surface 50 previously mentioned in FIG. 1.

Figure 4:
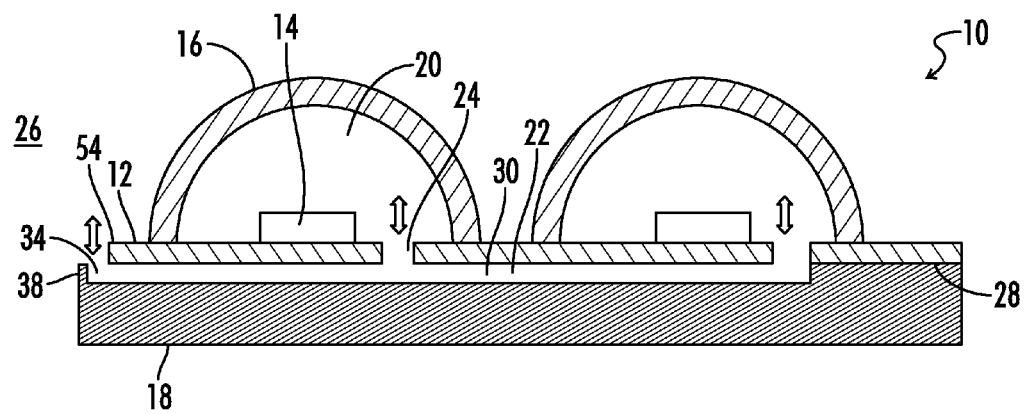
FIG. 4 is a partial cross-sectional view of a third embodiment of a light emitting apparatus according to the present invention.

A partial cross-section of a third embodiment of a light emitting apparatus of the present invention is seen in FIG. 4. The channel 30 can be defined in the substrate mating surface 28 of the heat sink 18. The channel 30 can extend in the substrate mating surface 28 beyond an outer edge 54 of the substrate 12. The exit opening 34 for the vent passage 34 can then be located in the substrate mating surface 28 between the outer edge of the substrate 54 and a raised peripheral edge 38 of the heat sink 18. Once again, the channel 30 in FIG. 4 constitutes the entire vent passage 22.

Figure 5:
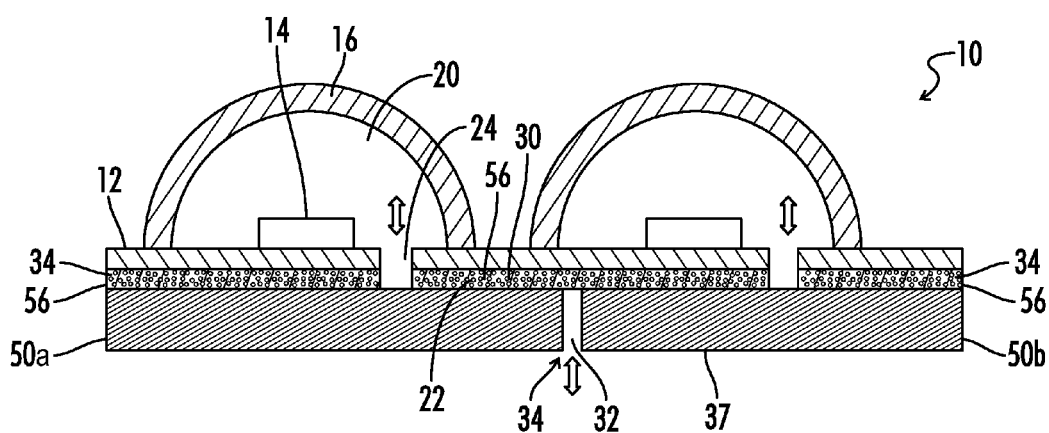
FIG. 5 is a partial cross-sectional view of the light emitting apparatus of FIG. 2 including a porous thermal interface material disposed in the vent passage.

Some embodiments can include a thermal interface material 56 disposed in the vent passage 22, as shown in FIG. 5. In some embodiments, the thermal interface material 30 is disposed within the entirety of the vent passage 22, including the channel 30 and the vent hole 32. In some embodiments, the thermal interface material 56 can be porous, such that gases can be vented through the thermal interface material 56. The thermal interface material 56 can be a suitable porous highly thermally conductive material which can be configured to cooperate with the heat sink 18 and vent passage 22 to further dissipate heat away from the light emitter 14 via the substrate 12.

The porous nature of the thermal interface material 56 can increase the surface area over which gases or air can pass as the gases or air flow through the vent passage 22. The increase in exposed surface area can help increase both radiation and convection between the heat sink 18, the thermal interface material 56, and gases or air flowing through the vent passage 22. Increased dissipation of heat from the light emitter 14 can also help decrease the temperature of the apparatus 10 and the amount of harmful gases produced by chemical contained on the apparatus 10, while concurrently allowing any harmful gases produced to be vented out of the space 20 about the light emitter 14. Reduction of the amount of harmful gases produced by the apparatus 10, as well as ventilation of the gases which are produced, can help prevent discoloration and fogging of the lens 16. In some embodiments, the thermal interface material 56 can also assist in preventing dust and water ingression into the space 20.

The embodiment of FIG. 5 also shows a vent passage 22 with multiple exit openings 34. An exit opening 34 for the vent passage 22 is located in each of the bottom 37, the first lateral side 50a, and the second lateral side 50b of the heat sink 18. Additional exit openings 34 for the vent passage 22 can help increase ventilation and circulation of the harmful gases from the space 20 about the light emitter 14.

Figure 6:
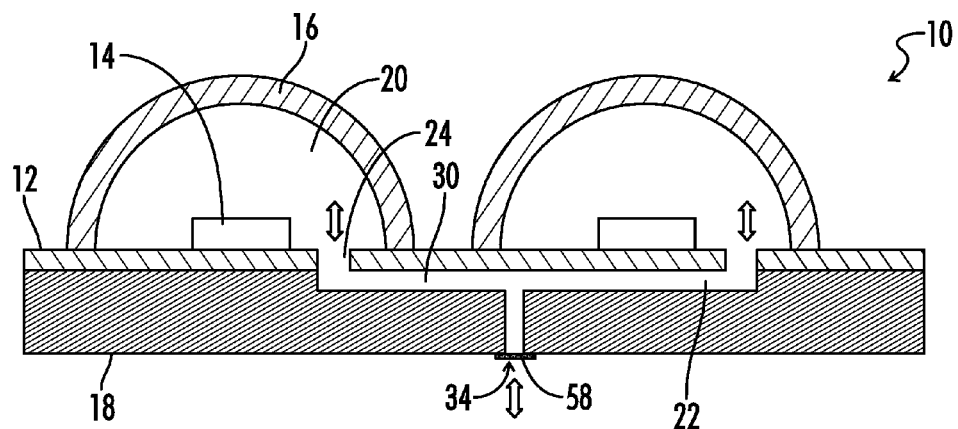
FIG. 6 is a partial cross-sectional view of the light emitting apparatus of FIG. 2 including a breathable barrier in communication with the vent passage.

Liquids and dust can be problematic for a light emitting apparatus. Liquids and dust can reduce the performance of the light emitting apparatus, as well as reduce the quality and quantity of light reaching a target surface. In an embodiment shown in FIG. 6, a breathable barrier 58 can be used to prevent dust and liquid ingression into the vent passage 22 and into the space 20 about the light emitter 14. The breathable barrier 58 can be a Porex™ patch or any other suitable material known in the art that can allow gases to pass through the vent passage 22 while preventing liquids and dust from entering into the vent passage 22 and the space 20 about the light emitter 14. In some embodiments the breathable barrier 32 can be positioned to cover the exit opening 34 in the vent passage 22, thereby preventing liquids or dust from entering any portion of the vent passage 22. In other embodiments, the breathable barrier 32 can be located within the vent passage 22.

Figure 7:
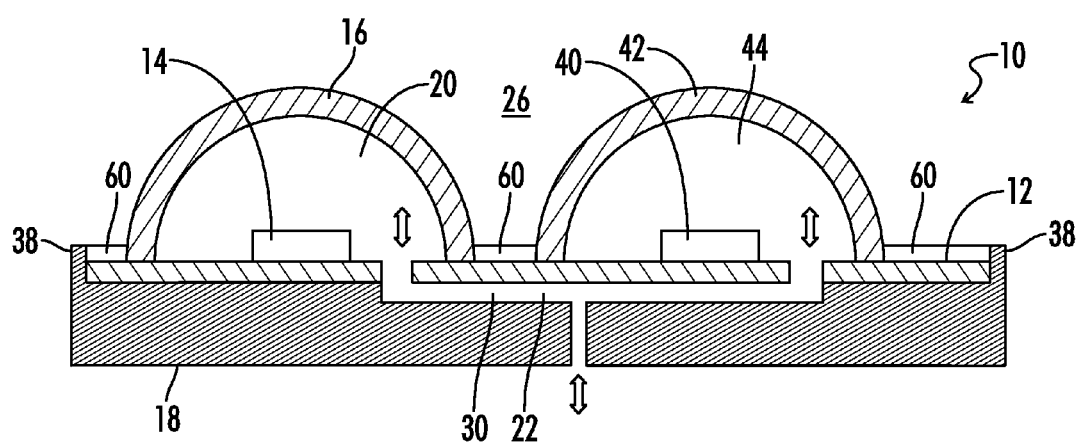
FIG. 7 is a partial cross-sectional view of the embodiment of FIG. 2 including an encapsulant disposed around a lens and a substrate.

In some embodiments, the apparatus 10 can further include an encapsulant 60, as shown in FIG. 7. The encapsulant 60 can at least partially cover the substrate 12 and the lens 16 in an area outside of the space 20 about the light emitter 14. The encapsulant 60 can adhere the lens 16 to the substrate 12. Additionally, the encapsulant 60 can provide a seal between the lens 16 and the substrate 12, thereby preventing contaminates such as liquids or dust from entering the space 20 about the light emitter 14 between the substrate 12 and the lens 16. In embodiments having a second light emitter 40 and a second lens 42, the encapsulant 60 can additionally at least partially cover second lens 42 and provide a seal between the substrate 12 and the second lens 42, thereby preventing contaminants from entering the second space 44.

The encapsulant 34 can be any suitable material known in the art that can seal the lens 16 and the substrate 12 from an exterior 26 of the apparatus 10 as shown in FIG. 7. The raised peripheral rim 38 of the heat sink 18 can also be configured to retain the encapsulant 60 in a space above the substrate 12 so the encapsulant 60 does not spill over the sides of the heat sink 18. This can help ensure that the encapsulant 60 forms a proper seal between the lens 16 and the substrate 12.

Figure 8:
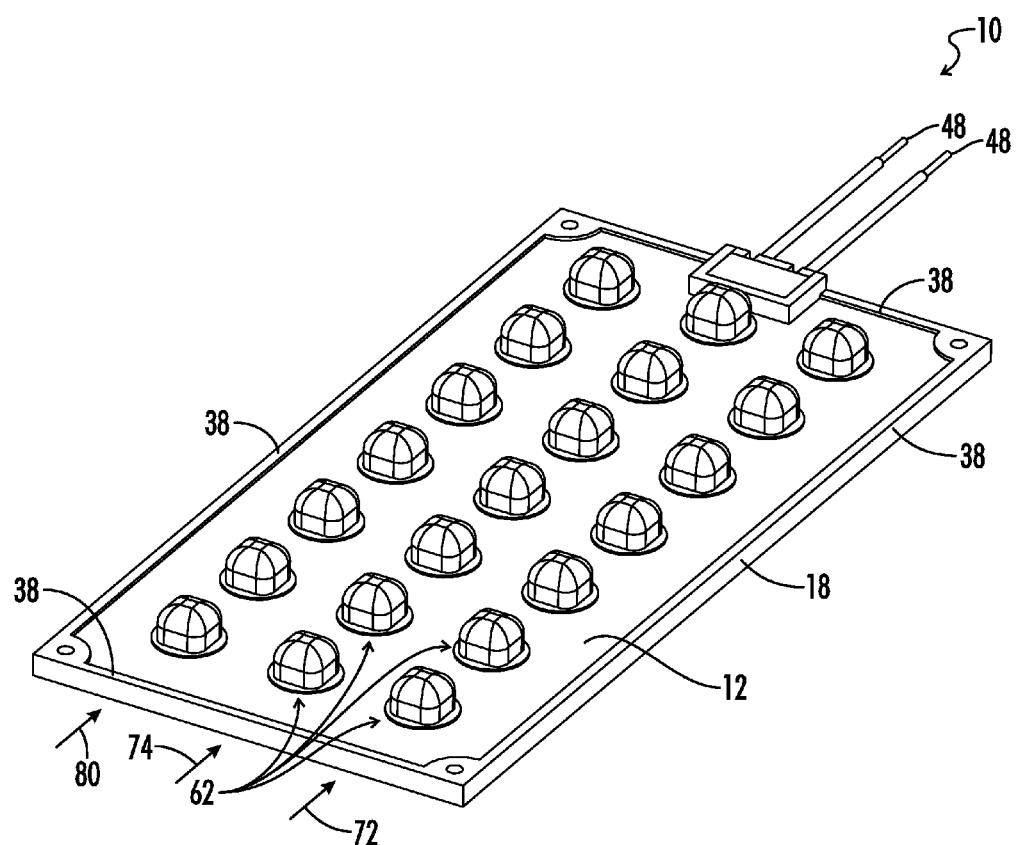
FIG. 8 is a perspective view of a fourth embodiment of a light emitting apparatus according to the present invention.
Figure 9:
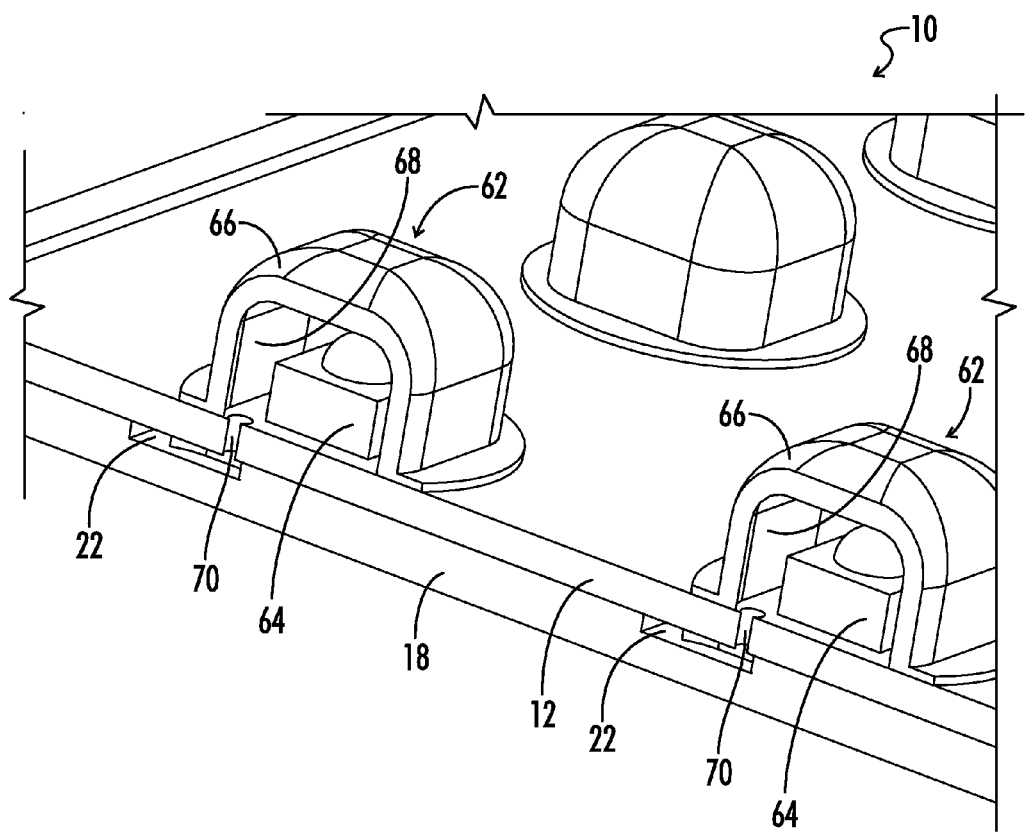
FIG. 9 is a partial cross-sectional view of the light emitting apparatus of FIG. 8.

Another embodiment of a light emitting apparatus 10 according to aspects of the present invention is shown in FIG. 8. A partial cross-section of the apparatus 10 of FIG. 8 is shown in FIG. 9. In some embodiments, the apparatus 10 can include a plurality of lighting assemblies 62 mounted on the substrate 12. Each lighting assembly in the plurality of lighting assemblies 62 can include a corresponding light emitter 64 and a corresponding lens 66. The corresponding lens 66 at least partially covers the corresponding light emitter 64 and defines a corresponding space 68 about the corresponding light emitter 64. The substrate 12 can include a plurality of openings 70, with each opening in the plurality of openings 70 communicated with a corresponding space 68 in a corresponding lighting assembly of the plurality of lighting assemblies 62. The vent passage 22 can then be communicated with each opening in the plurality of openings 70. As such, the vent passage 22 can communicate each opening in the plurality of openings 70 and therefore each corresponding space 68 in the plurality of lighting assemblies 62 with an exterior 26 of the heat sink 18. Therefore, multiple light emitters 64 and multiple spaces 68 about the light emitters 64 can be vented to remove harmful gases from the spaces 68.

Figure 10:
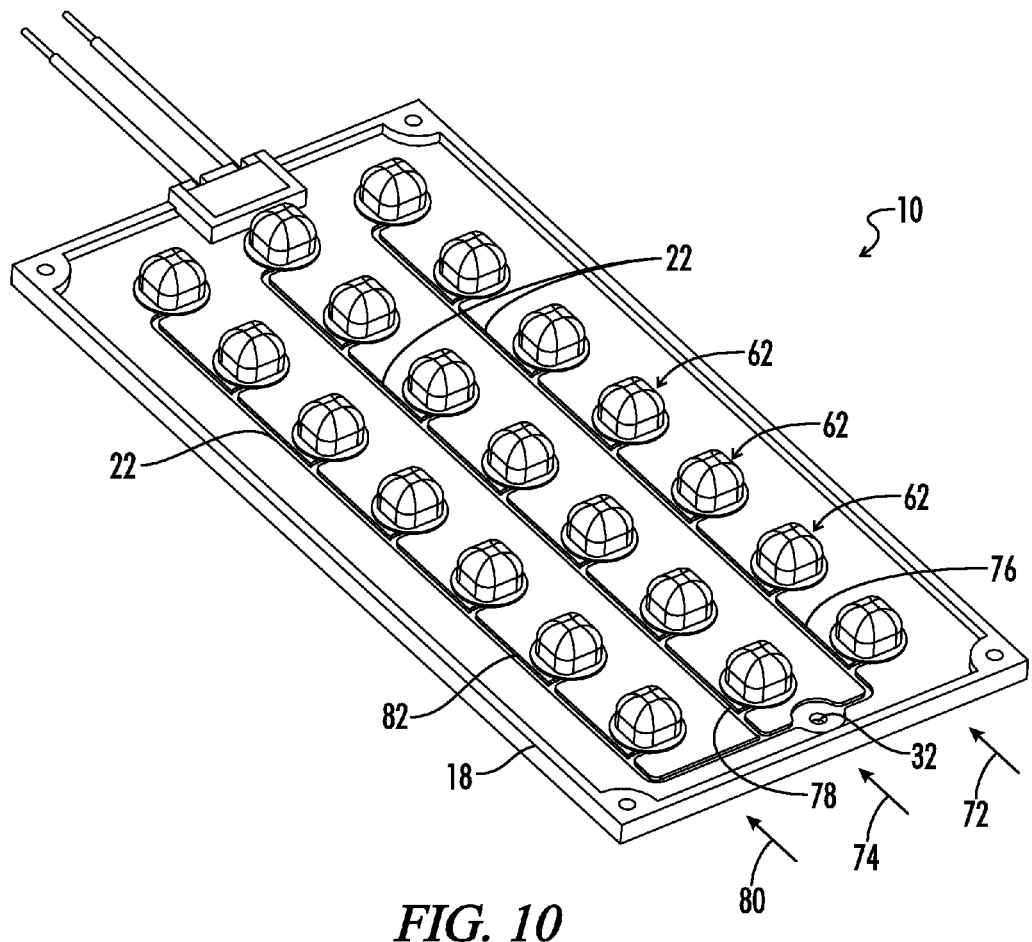
FIG. 10 is a perspective view of the light emitting apparatus of FIG. 8 with the substrate removed.

In some embodiments, as shown in FIG. 8, the plurality of lighting assemblies 62 can be defined as a first row 72 of lighting assemblies 62 and a second row 74 of lighting assemblies. FIG. 10 shows a perspective view of the apparatus 10 of FIG. 8 with the substrate removed. The vent passage 22 can include a first portion 76 and a second portion 78. The first portion 76 of the vent passage 22 can be communicated with the corresponding spaces of the first row 72 of lighting assemblies 62. The second portion 78 of the vent passage 22 can be communicated with the corresponding spaces of the second row 74 of lighting assemblies 62. The first and second portions 76, 78 of the vent passage 22 can converge on the vent hole 32 extending through the heat sink 18. In some embodiments, the plurality of lighting assemblies 62 can further be defined by a third row 80 of lighting assemblies 62. The vent passage 22 can further include a third portion 82 communicated with the corresponding spaces of the third row 80 of lighting assemblies 62. As such, multiple lighting assemblies 62 can be organized into multiple rows on the substrate 12, and the vent passage 22 can be divided into multiple portions, a portion communicated with each row of lighting assemblies 62.

Figure 11:
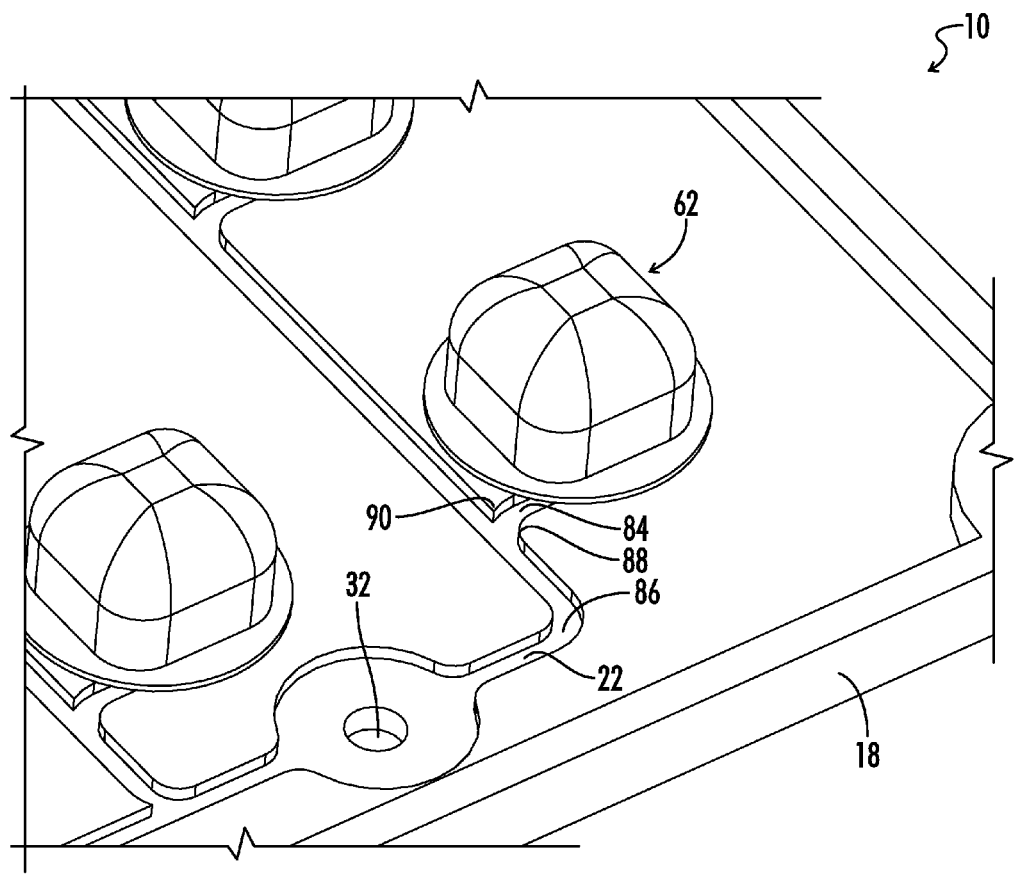
FIG. 11 is a detailed view of the light emitting apparatus of FIG. 10.

As shown in FIG. 11, the vent passage 22 can have one or more sub-passages 84 which can branch off from a primary passage 86 of the vent passage 22. Each sub-passage 84 leads to a corresponding opening 70 in the substrate 12 (not shown in FIG. 11), and subsequently to a corresponding lighting assembly 62. Where the sub-passage 84 meets the main passage 86, the sub-passage 84 can have a rounded edge on a side of the sub-passage nearest the vent hole 32. The sub-passage 84 can also have a pointed edge 90 on a side furthest from the vent hole 32. The pointed edge 90 can extend generally in the direction of the vent hole 32. As such, as gases are vented out of the lighting assemblies 62. The gases are directed by the rounded and pointed edges 88 and 90 respectively toward the vent hole 32 such that the gases do not flow back in the main passage 86 away from the vent hole 32. Additionally, as clean air flows into the main passage 86 through the vent hole 32, the clean air can be diverted from the main passage 86 by the rounded and pointed edges 88 and 90 respectively to help flush out harmful gases contained in the lighting assemblies 62.

Figure 12:
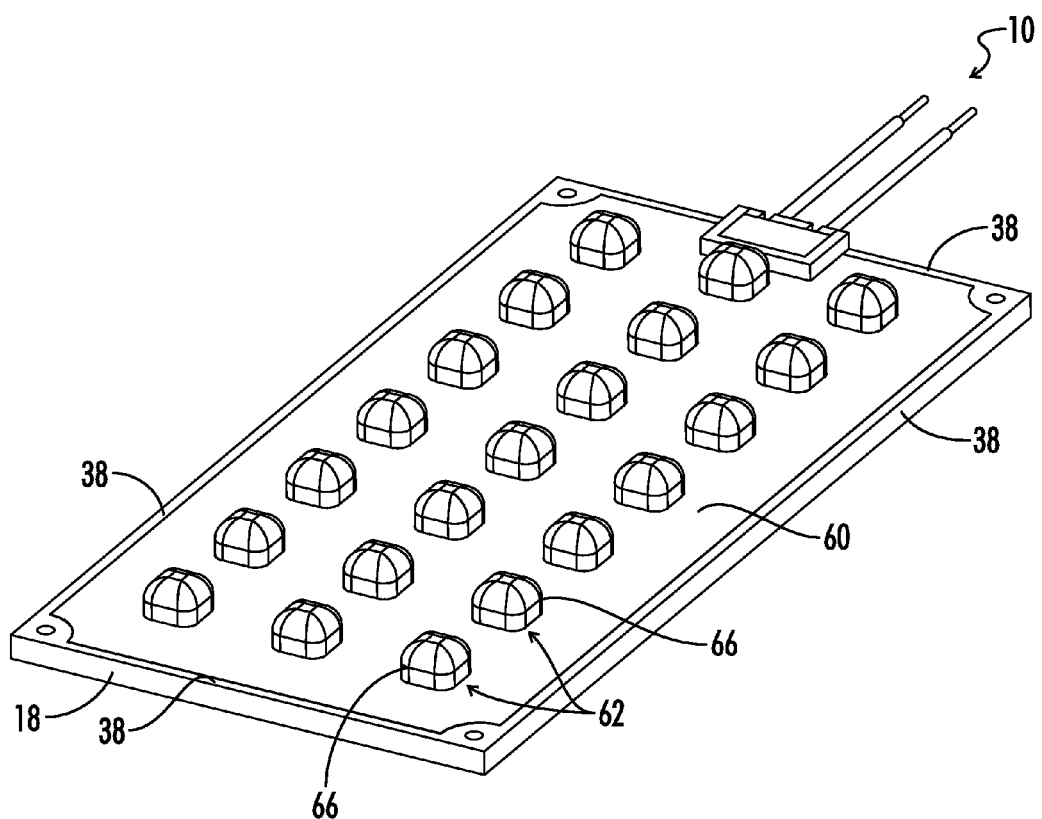
FIG. 12 is a perspective view of the light emitting apparatus of FIG. 8 including an encapsulant disposed around a plurality of lighting assemblies and a substrate.
Figure 13:
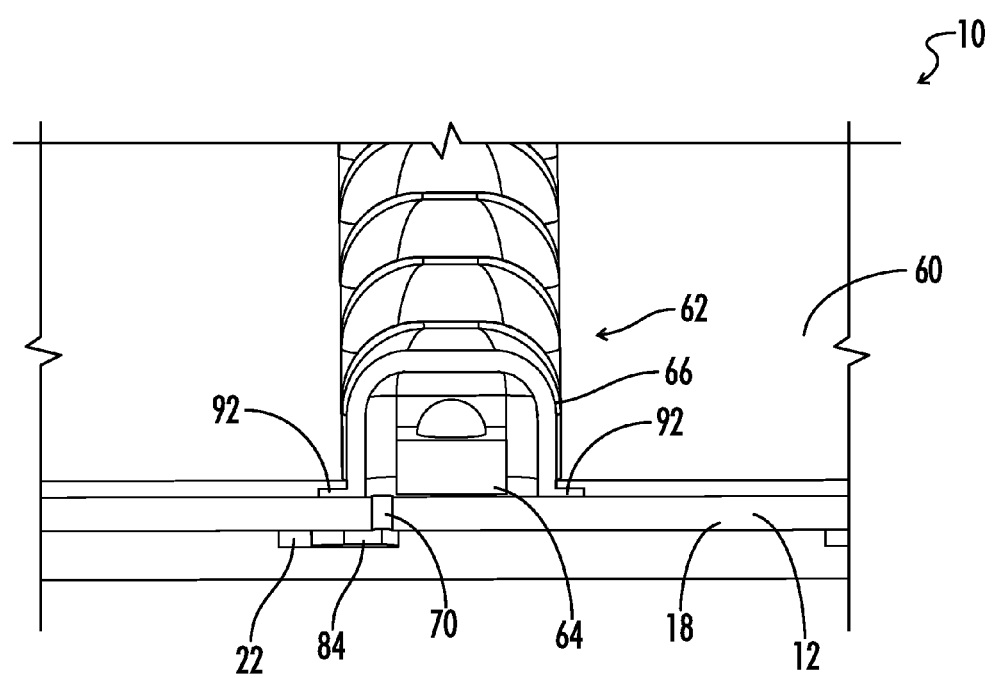
FIG. 13 is a partial cross-sectional view of the light emitting apparatus of FIG. 12.

FIG. 12 shows the apparatus of FIG. 8 including an encapsulant 60 at least partially covering the substrate and the lenses 66 in the plurality of lighting assemblies 62. The substrate is positioned beneath the encapsulant 60 in FIG. 12. The encapsulant 60 can help adhere each lens 66 in the plurality of lighting assemblies 62 to the substrate, as well as provide a seal between each lens 66 in the plurality of lighting assemblies 62 and the substrate. The encapsulant 60 can be retained in position over the substrate by the raised peripheral rim 38 on the heat sink 18.

A partial cross-section view of the apparatus of claim 12 is shown in claim 13. In some embodiments, the lenses 66 can include a peripheral flange 92 which can be positioned adjacent the substrate 12. The encapsulant 60 can then at least partially cover the peripheral flange 92 and the substrate 12 to adhere and provide a seal between the lenses 66 and the substrate 12. The peripheral flange 92 can provide a substantially horizontal surface which can provide a stronger contact between the encapsulant 60 and the lens 66 thereby providing a better adherence and seal between the lens 66 and the substrate 12.

Another aspect of the present invention is a method for venting an LED demonstrated by the various embodiments previously described. For clarity purposes, the method will be described as it pertains to the apparatus shown in FIG. 1, FIG. 2, and FIG. 6. The method includes the steps of mounting an LED 14 on a substrate 12, covering the LED 14 with a lens 16 to form an LED space or cavity 20, the space or cavity 20 formed between the substrate 12 and the lens 16. A heat sink 18 is attached to the substrate 12 on a side of the substrate 12 opposite the LED 14, providing an opening 24 in the substrate 12. The opening 24 is communicated with the LED cavity or space 20. A vent passage 22 is provided and is at least partially defined between the substrate 12 and the heat sink 18, the vent passage 22 communicating the opening 24 in the substrate 12 and the LED cavity or space 20 with an exterior 26 of the heat sink 18. In some embodiments, the vent passage 22 can further include an exit opening 34 to an exterior 26 of the heat sink 18, and the method can further include providing a breathable barrier over the exit opening, the breathable barrier allowing passage of gases but preventing the passage of liquid or dust through the vent passage 22.

Thus, although particular embodiments of the present invention of a new and useful Method of Venting LEDs has been described, it is not intended that such references be construed as limitations of the scope of this invention except as set forth in the claims that follow.

What is claimed is:

1. A light emitting apparatus comprising:
   a substrate;
   a light emitter mounted on the substrate;
   a lens at least partially covering the light emitter, the lens defining a space about the light emitter;
   a heat sink attached to the substrate, the heat sink configured to dissipate heat from the light emitter via the substrate;
   an opening in the substrate, the opening communicated with the space; and
   a vent passage at least partially defined between the heat sink and the substrate, the vent passage communicating the opening in the substrate with an exterior of the heat sink.

2. The apparatus of claim 1, wherein the heat sink further comprises:
   a substrate mating surface attached to the substrate; and
   a channel defined in the substrate mating surface, the channel communicated with the opening in the substrate, the channel forming at least a portion of the vent passage between the heat sink and the substrate.

3. The apparatus of claim 2, wherein the vent passage further comprises a vent hole through the heat sink, the vent hole communicating the channel defined in the substrate mating surface with the exterior of the heat sink, thereby communicating the opening in the substrate with the exterior of the heat sink.

4. The apparatus of claim 3, wherein the vent hole extends through an exterior surface of the heat sink positioned opposite the substrate mating surface on the heat sink.

5. The apparatus of claim 2, wherein:
the heat sink further comprises a lateral perimeter surface; and
the channel defined in the substrate mating surface extends through the lateral perimeter surface to communicate the opening in the substrate with the exterior of the heat sink.

6. The apparatus of claim 2, wherein the channel extends beyond the substrate on the substrate mating surface, such that an exit opening for the vent passage is formed in the substrate mating surface.

7. The apparatus of claim 1, further comprising a porous thermal interface material disposed in the vent passage.

8. The apparatus of claim 1, further comprising:
a second light emitter mounted on the substrate;
a second lens at least partially covering the second light emitter, the second lens defining a second space about the second light emitter;
a second opening in the substrate, the second opening communicated with the second space; and
the vent passage communicating the second opening with an exterior of the heat sink.

9. The apparatus of claim 1, wherein:
the apparatus further comprises
a plurality of lighting assemblies mounted to the substrate, each lighting assembly including a corresponding light emitter and a corresponding lens at least partially covering the corresponding light emitter, the corresponding lens defining a corresponding space about the corresponding light emitter, and
a plurality of openings in the substrate, each opening in the substrate communicated with a corresponding space in a corresponding lighting assembly of the plurality of lighting assemblies; and
the vent passage communicates each opening in the plurality of openings with the exterior of the heat sink.

10. The apparatus of claim 9, wherein:
the plurality of lighting assemblies further comprises a first row of lighting assemblies and a second row of lighting assemblies;
the vent passage further comprises a first portion and a second portion;
the first portion of the vent passage is communicated with the openings in the substrate corresponding to the first row of lighting assemblies; and
the second portion of the vent passage is communicated with the openings in the substrate corresponding to the second row of lighting assemblies.

11. The apparatus of claim 1 wherein the lens is a diffuser.

12. The apparatus of claim 1, further comprising a breathable barrier in communication with the vent passage, the breathable barrier configured to allow gases to pass through the vent passage while preventing liquid and dust from passing through the vent passage.

13. The apparatus of claim 1, wherein an encapsulant at least partially covers the lens and the substrate, the encapsulant providing a seal between the lens and the substrate.

14. The apparatus of claim 1, wherein the substrate is a printed circuit board.

15. A light emitting apparatus comprising:
a substrate;
an LED mounted on the substrate;
a lens attached to the substrate, the lens defining a space about the LED between the lens and the substrate;
a heat sink attached to the substrate, the heat sink configured to dissipate heat away from the LED via the substrate;
an opening in the substrate, the opening communicated with the space about the LED; and
a vent passage at least partially defined between the substrate and the heat sink, the vent passage communicating the opening in the substrate with an exterior of the apparatus.

16. The apparatus of claim 15, wherein:
the lens further comprises a peripheral flange positioned adjacent the substrate; and
the apparatus further comprises an encapsulate covering the substrate and the flange on the lens, the encapsulant providing a seal between the lens and the substrate.

17. The apparatus of claim 16, wherein the heat sink has a raised peripheral rim configured to retain the encapsulant.

18. The apparatus of claim 15, wherein the heat sink defines a housing for the apparatus.

19. A method of venting an LED light source, the method comprising:
(a) mounting an LED on a substrate;
(b) covering the LED with a lens to form an LED cavity about the LED, the LED cavity formed between the substrate and the lens;
(c) attaching a heat sink to the substrate on a side of the substrate opposite the LED; and
(d) providing an opening in the substrate in communication with the LED cavity and providing a vent passage at least partially defined between the substrate and the heat sink, the vent passage communicating the opening in the substrate and the LED cavity with an exterior of the heat sink.

20. The method of claim 19, wherein the vent passage further comprises an exit opening to an exterior of the heat sink, and the method further comprises providing a breathable barrier over the exit opening, the breathable barrier allowing the passage of gases through the vent passage while preventing the passage of liquid and dust through the vent passage.

* * * * *